(12) United States Patent
Chiu et al.

(10) Patent No.: US 11,195,831 B2
(45) Date of Patent: Dec. 7, 2021

(54) 3D SEMICONDUCTOR STRUCTURE AND METHOD OF FABRICATING THE SAME

(71) Applicant: UNITED MICROELECTRONICS CORP., Hsin-Chu (TW)

(72) Inventors: Yung-Chen Chiu, Taichung (TW); Sheng-Yuan Hsueh, Tainan (TW); Kuo-Hsing Lee, Hsinchu County (TW); Chien-Liang Wu, Pingtung County (TW); Chih-Kai Kang, Tainan (TW); Guan-Kai Huang, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 236 days.

(21) Appl. No.: 16/596,764

(22) Filed: Oct. 9, 2019

(65) Prior Publication Data
US 2021/0082911 A1 Mar. 18, 2021

(30) Foreign Application Priority Data

Sep. 12, 2019 (CN) .......................... 201910862593.5

(51) Int. Cl.
H01L 29/778 (2006.01)
H01L 27/06 (2006.01)
H01L 27/085 (2006.01)
H01L 29/66 (2006.01)

(52) U.S. Cl.
CPC ........ *H01L 27/0694* (2013.01); *H01L 27/085* (2013.01); *H01L 29/66462* (2013.01); *H01L 29/7787* (2013.01)

(58) Field of Classification Search
CPC ........... H01L 27/0694; H01L 29/66462; H01L 29/7787
USPC ........................................................ 257/194
See application file for complete search history.

(56) References Cited

U.S. PATENT DOCUMENTS

2021/0043795 A1* 2/2021 Turski .................. H01S 5/2216

FOREIGN PATENT DOCUMENTS

CN 106981513 7/2017

OTHER PUBLICATIONS

Wang, Flexible AlGaInN/GaN Heterostructures for High-Hole-Mobility Transistors, Jun. 27, 2017.

* cited by examiner

*Primary Examiner* — Elias Ullah
(74) *Attorney, Agent, or Firm* — Winston Hsu

(57) ABSTRACT

A 3D semiconductor structure includes a buffer layer, a n-type high electron mobility transistor (HEMT) disposed on a first surface of the buffer layer, and a p-type high hole mobility transistor (HHMT) disposed on a second surface of the buffer layer opposite to the first surface.

11 Claims, 5 Drawing Sheets

3D SEMICONDUCTOR STRUCTURE AND METHOD OF FABRICATING THE SAME

BACKGROUND OF THE INVENTION

1. Field of the Invention

The present invention generally relates to a 3D semiconductor structure, and more specifically, to a 3D semiconductor structure with high electron mobility transistors (HEMT) and high hole mobility transistors (HHMT).

2. Description of the Prior Art

With the recent upsurge of the wireless communication market, as well as the steady but continuous progress of power applications, microwave transistors are playing critical roles in many aspects of human activities. The requirements for the performance of microwave transistors are becoming more and more demanding. In the personal mobile communication applications, next generation cell phones require wider bandwidth and improved efficiency. The same requirement holds for broadband wireless internet connections as well because of the ever increasing speed or data transmission rate. Because of these needs, there has been significant investment in the development of high performance microwave transistors and amplifiers based on semiconductor materials such as Si/SiGe, GaAs, SiC, with both the characteristics of large breakdown voltage and high electron velocity.

Among them, the ability of GaN to form heterojunctions makes it a superior material to be used to fabricate high electron mobility transistors (HEMT). The advantages of HEMT include its high carrier concentration and its higher electron mobility due to reduced ionized impurity scattering. The combination of high carrier concentration and high electron mobility results in the characteristics of high current density and low channel resistance, which are especially important for high frequency operation and power switching applications.

In the depletion mode (D-mode) of high electron mobility transistor, the electric field generated by gate electrode is used to deplete a two dimensional electron gas (2DEG) channel at interface of wide energy band gap and narrow energy band gap of semiconductor, such as an interface between AlN/GaN or between AlGaN/GaN. A control voltage can be applied to the gate electrode to directly affect and control the amount of current flowing through the channel. The depletion mode transistors function as "normally-on" devices when used as switches. For an HEMT in enhancement mode (E-mode), no channel is present and no current flow occurs until the transistor is biased for operation. In particular, the transistor is biased and a voltage is applied to the gate electrode in order to move the 2DEG channel below the Fermi level. Once another voltage is applied between the source and drain, the electrons in the 2DEG channel would move from source to drain. The enhancement mode transistors are generally used in digital and analog integrated circuits (ICs) and can function as "normally-off" devices. Enhancement mode HEMTs are also useful for analog circuit applications, such as RF/microwave power amplifiers or switches.

Current research in AlGaN/GaN HEMTs shows promise for high power and high temperature applications. Accordingly, there still have a need in the art for improved methods and structures for devices capable of performing in high power, high voltage, high speed, and/or high temperature applications.

SUMMARY OF THE INVENTION

The present invention hereby provides a 3D semiconductor structure with high electron mobility transistors (HEMT) and high hole mobility transistors (HHMT), characterized by vertically integrating complementary n-type and p-type field effect transistors in three-dimensional space.

One aspect of the present invention is to provide a 3D semiconductor structure, including a buffer layer with a first surface and a second surface opposite to the first surface, a n-type high electron mobility transistor (HEMT) disposed on the first surface of the buffer layer, and a p-type high hole mobility transistor (HHMT) disposed on the second surface of the buffer layer.

Another aspect of the present invention is to provide a method of fabricating a 3D semiconductor structure, including steps of providing a substrate, sequentially forming a doped aluminum gallium nitride barrier layer, a doped gallium nitride channel layer, a buffer layer, an undoped gallium nitride channel layer and an undoped aluminum gallium nitride barrier layer on the substrate, wherein a two-dimensional hole gas (2DEG) is formed in the doped gallium nitride channel layer, and a two-dimensional electron gas (2DEG) is formed in the undoped gallium nitride channel layer, forming a first gate, a first source and a first drain on the undoped aluminum gallium nitride barrier layer, wherein the undoped gallium nitride channel layer, the undoped aluminum gallium nitride barrier layer, the first gate, the first source and the first drain form a n-type high electron mobility transistor, covering a first passivation layer on the undoped aluminum gallium nitride barrier layer, the first gate, the first source and the first drain, flipping the substrate and removing the substrate to expose the doped aluminum gallium nitride barrier layer, and forming a second gate, a second source and a second drain on the doped aluminum gallium nitride barrier layer, wherein the doped gallium nitride channel layer, the doped aluminum gallium nitride barrier layer, the second gate, the second source and the second drain form a p-type high hole mobility transistor.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
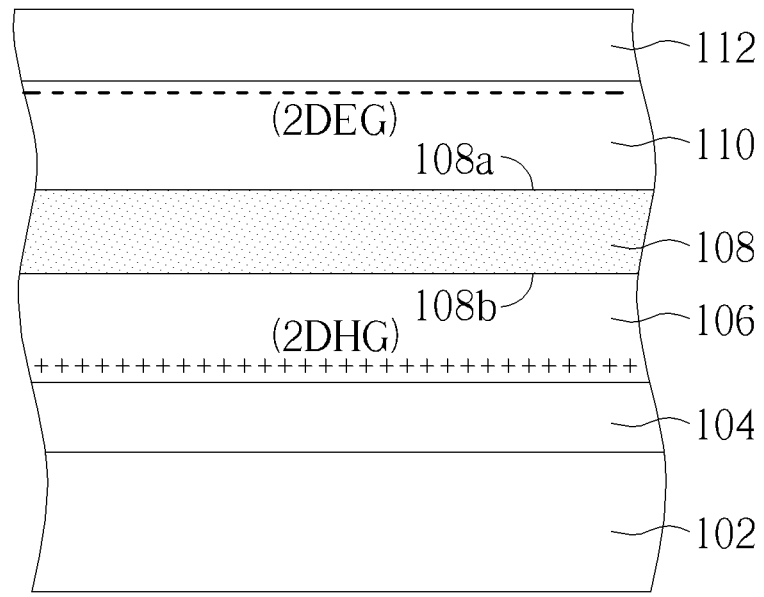
FIGS. 1-6 are schematic cross-sections illustrating the steps of fabricating a 3D semiconductor structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

The method of fabricating a 3D semiconductor structure will be described hereinafter according to the embodiment of present invention. FIGS. 1-6 are schematic cross-sections sequentially illustrating the 3D semiconductor structure in different fabrication stages. The 3D semiconductor structure of the present invention includes high electron mobility transistors (HEMT) and high hole mobility transistors (HHMT). These field effect transistors are provided with junctions between materials with different bandgaps (i.e. heterojunctions) to function as channels, rather than using normal doped regions as channels like those in metal-oxide-semiconductor field-effect transistors (MOSFETs).

Please refer to FIG. 1. First, a substrate 102 is provided. The substrate 102 may be made of silicon (Si) or other semiconductor materials. In some embodiments, the substrate 102 is a sapphire wafer with semiconductor layers formed thereon, such as a silicon layer having <111> lattice structure. The Si <111> layer may provide an optimal lattice matching with overlying layers, such as a gallium nitride (GaN) layer or an aluminum gallium nitride (AlGaN) layer. In some embodiments, the semiconductor layer may be made of a compound semiconductor such as silicon carbide (SiC), gallium arsenic (GaAs), indium arsenide (InAs), or indium phosphide (InP). In some embodiments, the semiconductor layer is made of an alloy semiconductor such as silicon germanium, silicon germanium carbide, gallium arsenic phosphide, or gallium indium phosphide. For the clarity of drawings, the semiconductor layer will not be shown in figures.

In addition, before forming following overlying structures, a buffer layer (not shown) may be first formed on the substrate 102 to compensate and buffer the dismatch of lattice structures and coefficients of thermal expansion between the substrate 102 and the overlying structures. In some embodiments, materials of the buffer layer may be gallium nitride. For the clarity of drawings, the buffer layer will not be shown in figures.

Refer again to FIG. 1. Form a doped aluminum gallium nitride (AlGaN) barrier layer 104 and a doped gallium nitride (GaN) channel layer 106 sequentially on the substrate 102. In the embodiment of present invention, the doped aluminum gallium nitride barrier layer 104 and the doped gallium nitride channel layer 106 are doped with p-type dopants. Examples of the p-type dopants include but not limited to carbon (C), iron (Fe), magnesium (Mg), or zinc (Zn), etc. A heterojunction will be formed between the doped AlGaN barrier layer 104 and the doped GaN channel layer 106 that is doped with p-type dopants, with a bandgap discontinuity therebetween. In some embodiments, the bandgap of doped AlGaN barrier layer 104 is larger than the bandgap of doped GaN channel layer 106. Holes generated in the barrier layer 104 by piezoelectric polarization at heterojunction will fall into the channel layer 106, thereby forming a film with high hole mobility and conductivity. That is two dimension hole gas (2DHG) in the doped GaN channel layer 106, which is near the interface with the doped AlGaN barrier layer 104. Holes in the two dimension hole gas will be the charge carrier in high hole mobility transistor. In some embodiment, the doped AlGaN barrier layer 104 and the doped GaN channel layer 106 may be formed by epitaxial growth process. Example of this process includes but not limited to metal organic chemical-vapor deposition (MOCVD), molecular beam epitaxy (MBE) and hydride vapour phase epitaxy (HVPE), etc. The doped AlGaN barrier layer 104 may be characterized by its gradual composition transition ($Al_yGa_{1-y}N$), wherein y is composition ratio of aluminum in AlGaN, and y is from 0 to 1.

Refer again to FIG. 1. A buffer layer 108 is then formed on the doped GaN channel layer 106. In the embodiment of present invention, the buffer layer 108 is disposed between a high electron mobility transistors (HEMT) and a high hole mobility transistors (HHMT) to function as a transition layer for layer structures and energy bands therebetween. The buffer layer 108 may be made of different materials. For example, in one embodiment, the material of buffer layer 108 may be GaN and is doped with dopants the same as the dopant in doped GaN channel layer 106 and doped AlGaN barrier layer 104, such as C, Fe, Mg or Zn. Furthermore, the concentration of dopant in buffer layer 108 would gradually increases from zero at first surface 108a to the same concentration as the concentration of dopant in doped GaN channel layer 106 at second surface 108b (the surface adjacent to the doped GaN channel layer 106). In some embodiments, the buffer layer 108 may be a wide-bandgap layer, i.e. the bandgap of its material is larger than the bandgap at the interface between buffer layer 108 and doped GaN channel layer 106 or larger than the interface adjacent to other layer structures. While in some embodiment, buffer layer 108 may be a super lattice stack. For example, the super lattice stack may include alternating aluminum gallium nitride layers and gallium nitride layers (AlGaN/GaN) or include alternating aluminum gallium nitride layers and indium gallium nitride (AlGaN/InGaN) layers. The composition and efficiency about the buffer layer 108 will be fully detailed in following embodiments. In the embodiment, the buffer layer 108 may be formed by epitaxial growth process. For example, in the condition that the dopant is Mg, magnesocene $((C_5H_5)_2Mg)$ may be used as a precursor in MOCVD, MBE, or HVPE process to form the buffer layer 108.

Refer again to FIG. 1. After the buffer layer 108 is formed, an undoped GaN channel layer 110 and an undoped AlGaN barrier layer 112 are sequentially formed on the buffer layer 108. A heterojunction will be formed between the undoped GaN channel layer 110 and the undoped AlGaN barrier layer 112, with a bandgap discontinuity therebetween. In some embodiments, the bandgap of undoped AlGaN barrier layer 112 is larger than the bandgap of undoped GaN channel layer 110. Electrons generated in the barrier layer 112 by piezoelectric polarization at heterojunction will fall into the channel layer 110, thereby forming a film with high electron mobility and conductivity. That is two dimension electron gas (2DEG) in the undoped GaN channel layer 110, which is near the interface with the undoped AlGaN barrier layer 112. Electrons in the two dimension electron gas will be the charge carrier in high electron mobility transistor. In some embodiment, the undoped AlGaN barrier layer 112 and the undoped GaN channel layer 110 may be formed by epitaxial growth process. Example of this process includes but not limited to MOCVD, MBE or HVPE process, etc. The undoped AlGaN barrier layer 112 may be characterized by its gradual composition transition $(Al_yGa_{1-y}N)$, wherein y is composition ratio of aluminum in AlGaN, and y is from 0 to 1.

The steps of forming doped AlGaN barrier layer 104, doped GaN channel layer 106, buffer layer 108, undoped GaN channel layer 110 and undoped AlGaN barrier layer 112 described in the embodiments above may be in-situ performed in the same chamber without removing to another chamber, thereby saving cost and reducing pollution. Furthermore, in other embodiments, the layer structures described above may be formed in reverse order. That is, to form undoped AlGaN barrier layer 112, undoped GaN channel layer 110, buffer layer 108, doped GaN channel layer 106 and doped AlGaN barrier layer 104 sequentially on the substrate 102.

Due to the naturally occurring of two dimensional electron gas (2DEG) and two dimensional hole gas (2DHG) without gate structure, the transistor formed by these structures (e.g. HEMT and HHMT) would be conductive without the application of a voltage to the gate electrode. Therefore, the transistor would be a normally-ON device in a negative threshold voltage. Such a normally-ON state is a design concern in power applications where it is desirable to prevent, or substantially inhibit, the current from flowing in or through the transistor. In some embodiments, in order to convert a normally-ON HEMT device to a normally-OFF HEMT device, a gate structure is configured over the barrier layer of the transistor to deplete the two dimensional electron gas or the two dimensional hole gas under the gate structure. The details will be described in later embodiments.

Figure 2:
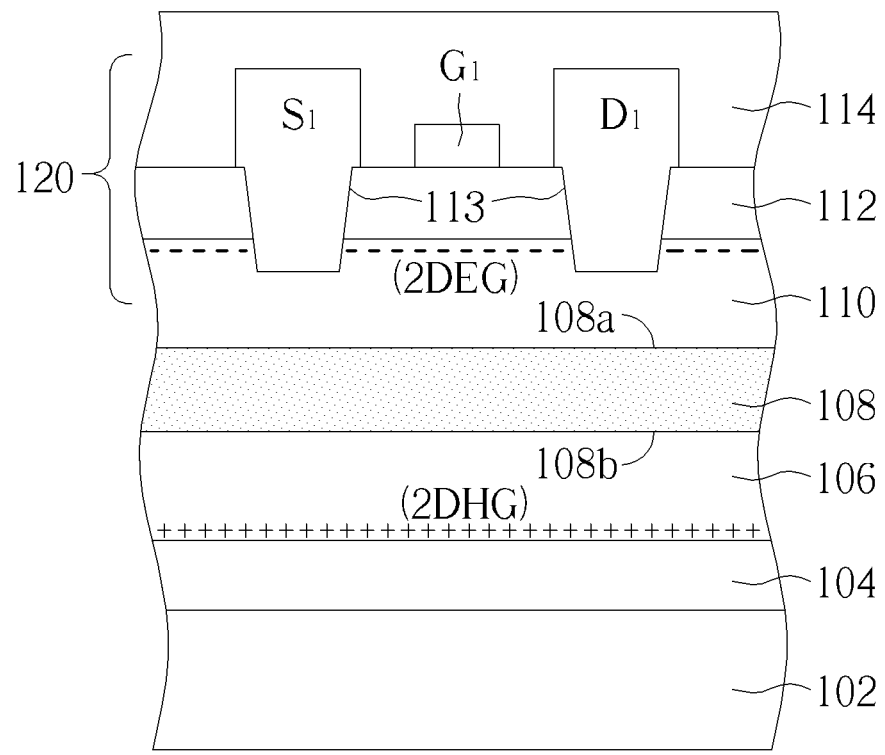

Please refer now to FIG. 2. After undoped AlGaN barrier layer 112 is formed, a photolithography process is then performed to form source/drain recesses 113 in the undoped AlGaN barrier layer 112. As shown in figure, the source/drain recesses 113 would extend into a portion of undoped GaN channel layer 110 through the undoped AlGaN barrier layer 112 and cut off the two-dimensional electron gas (2DEG) therein. After the source/drain recesses 113 are formed, a first source $S_1$ and a first drain $D_1$ are then formed respectively on the source/drain recesses 113. The first source $S_1$ and the first drain $D_1$ may be formed by following method: first, forming a metal layer on the source/drain recesses 113 and the undoped AlGaN barrier layer 112 by deposition process. In some embodiments, the metal layer may include one or more conductive materials, for example, Ti, Co, Ni, W, Pt, Ta, Pd, Mo, TiN, an AlCu alloy and alloys thereof. The gate electrode 118, the source 12 and the drain 122 may be formed separately or simultaneously by deposition process and photolithography processes. The deposition process includes a chemical vapor deposition (CVD), a physical vapor deposition (PVD), an atomic layer deposition (ALD), a high density plasma CVD (HDPCVD), a metal organic CVD (MOCVD), a plasma enhanced CVD (PECVD), or other applicable processes. Thereafter the metal layer is patterned into the first source $S_1$ and the first drain $D_1$ by photolithography process.

Refer again to FIG. 2. After the first source $S_1$ and the first drain $D_1$ are formed, a first gate $G_1$ is formed on the undoped AlGaN barrier layer 112 between the first source $S_1$ and the first drain $D_1$. In some embodiments, the first gate $G_1$ includes a conductive material layer that includes a refractory metal or the respective compounds including, e.g., titanium (Ti), titanium nitride (TiN), titanium tungsten (TiW), and tungsten (W), etc. Alternatively, the first gate $G_1$ may include nickel (Ni), gold (Au), copper (Cu), or the alloys thereof. The first gate $G_1$ may be formed by deposition process and photolithography process like the one in first source $S_1$ and first drain $D_1$. A gate dielectric layer may be formed between the first gate $G_1$ and the undoped AlGaN barrier layer 112 to increase the threshold voltage of HEMT 120. For the purpose of simplicity and clarity of description and drawing, relevant processes of the gate dielectric layer will not be shown in the figures.

Refer again to FIG. 2. After the first gate $G_1$, the first source $S_1$ and the first drain $D_1$ are all formed, a passivation layer 114 is covered on entire undoped AlGaN barrier layer 112, the first gate $G_1$, the first source $S_1$ and the first drain $D_1$ to provide protection. The material of passivation layer 114 may be polyimide. In some embodiments, circuit structures such as contacts and/or metal wirings may be formed on the undoped AlGaN barrier layer 112 before forming the passivation layer 114. Since those components are not the key point of present invention, they will not be shown in the figures. In the embodiment of present invention, the undoped GaN channel layer 110, the undoped AlGaN barrier layer 112, the two dimensional electron gas (2DEG), the first gate $G_1$, the first source $S_1$ and the first drain $D_1$ form a n-type high electron mobility transistors (HEMT) 120 on the first surface 108a of buffer layer 108. The current of device may be controlled by applying voltage to the first gate $G_1$.

Figure 3:
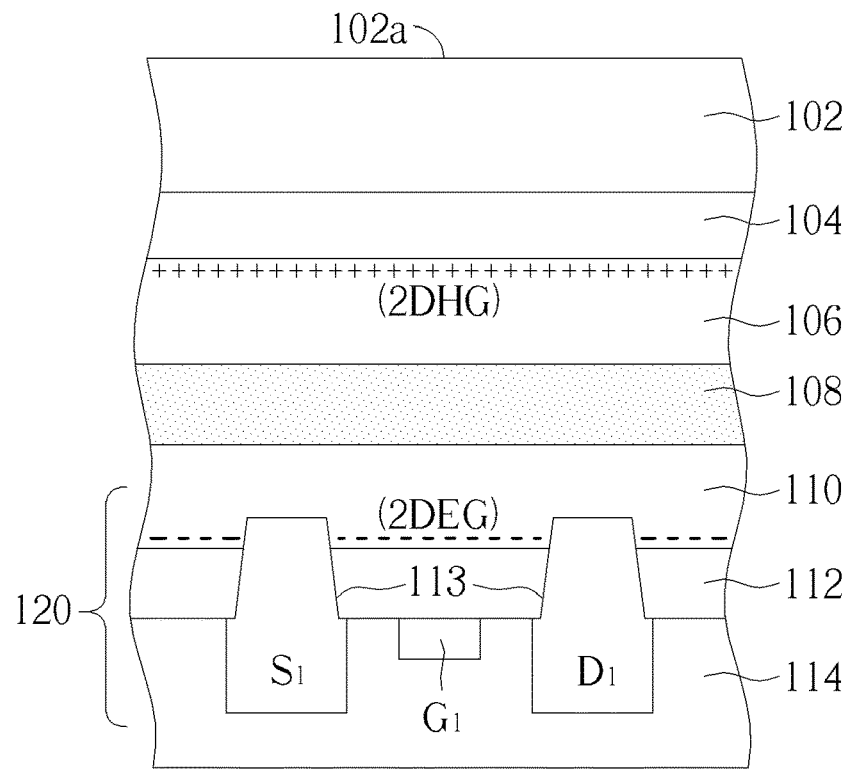

Please refer to FIG. 3. After the n-type HEMT 120 is completed, the substrate 102 is flipped, including the layer structures formed thereon, so that the backside 102a of the substrate 102 would be face up to serve as a process surface.

Figure 4:
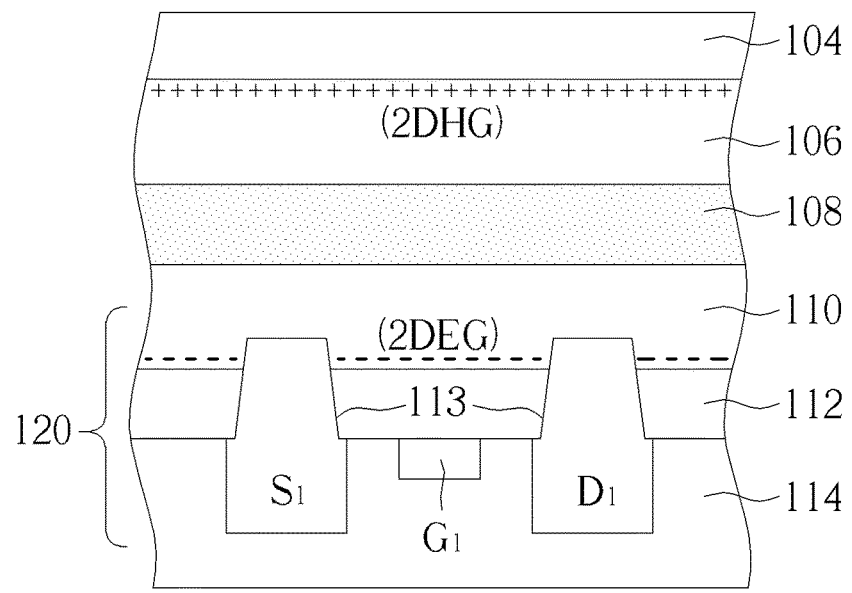

Next, as shown in FIG. 4, a backside grinding process is performed on the backside 102a of substrate 102 to remove the substrate 102 and expose the underlying doped AlGaN barrier layer 104, so that we can start the fabrication of high hole mobility transistors (HHMT).

Figure 5:
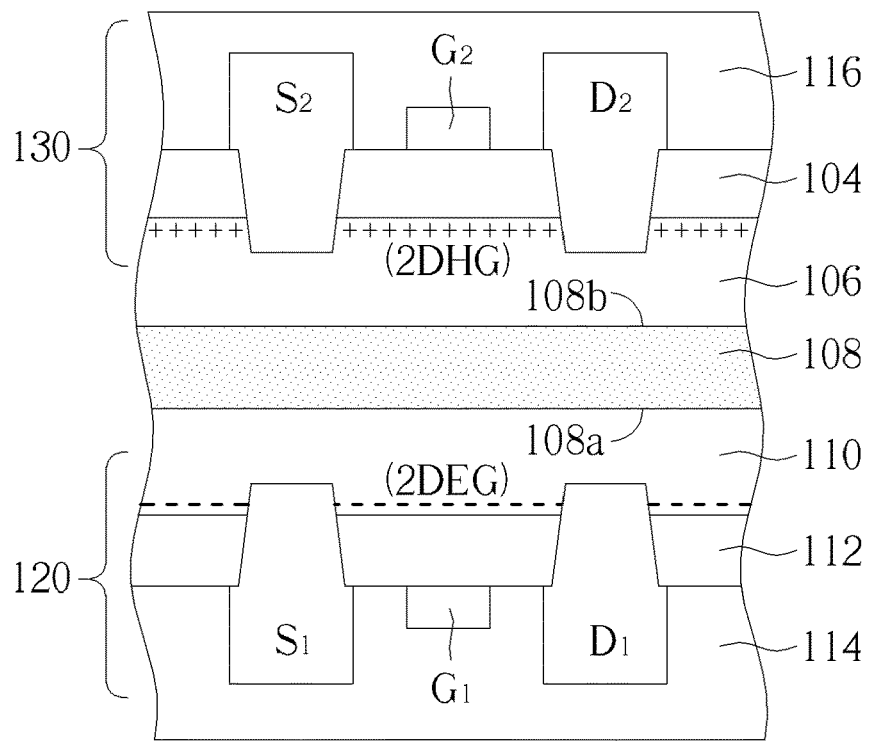

Please refer to FIG. 5. After the doped AlGaN barrier layer 104 is exposed, a second gate $G_2$, a second source $S_2$ and a second drain $D_2$ are formed on the doped AlGaN barrier layer 104. The materials and fabrication method of the second gate $G_2$, second source $S_2$ and second drain $D_2$ are the same as the ones for the first gate $G_1$, first source $S_1$ and first drain $D_1$. Relevant details are herein omitted. The second source $S_2$ and the second drain $D_2$ would extend into a portion of doped GaN channel layer 106 through entire doped AlGaN barrier layer 104 and cut off the two-dimensional hole gas (2DHG) therein. A passivation layer 116 is formed to cover on entire doped AlGaN barrier layer 104, the second gate $G_2$, the second source $S_2$ and the second drain $D_2$ to provide protection. In the embodiment of present invention, the doped GaN channel layer 106, the doped AlGaN barrier layer 104, the two dimensional hole gas (2DHG), the second gate $G_2$, the second source $S_2$ and the second drain $D_2$ form a p-type high hole mobility transistors (HHMT) 130 on the second surface 108b of buffer layer 108, which is opposite to the n-type high electron mobility transistors (HEMT) 120 on the first surface 108a of buffer layer 108.

Figure 6:
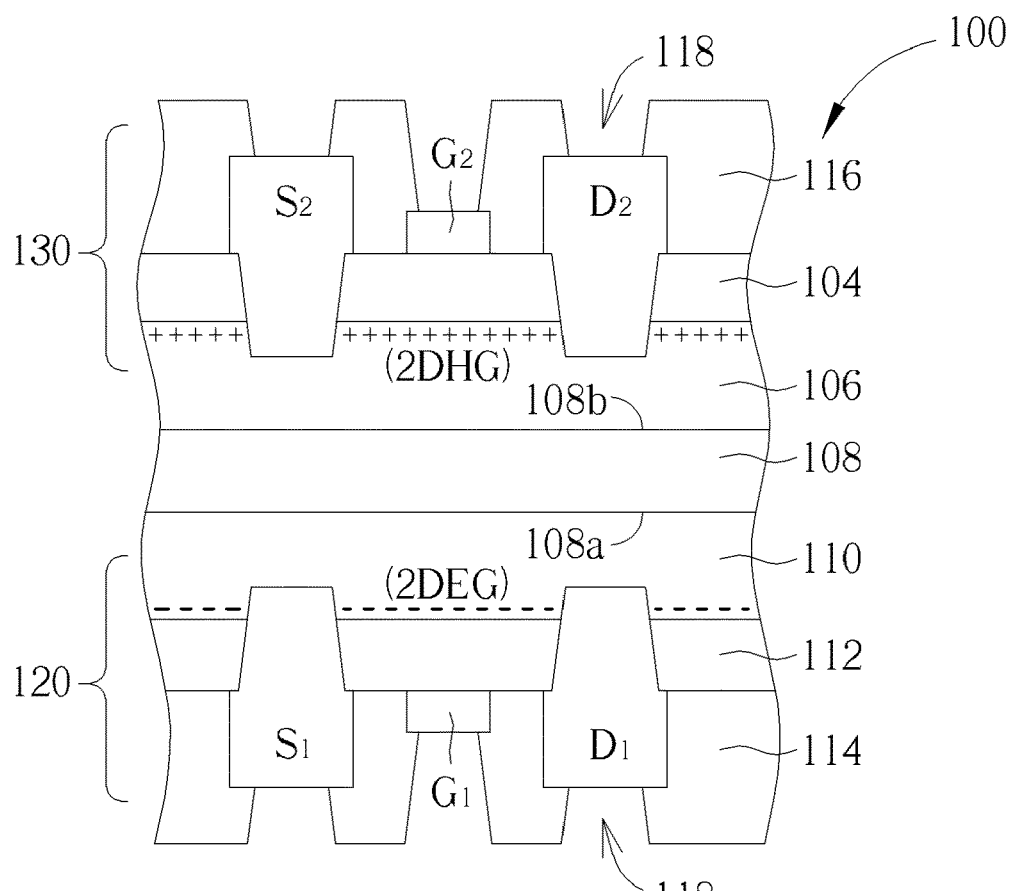

Please refer to FIG. 6. After the n-type high electron mobility transistors (HEMT) 120 and the p-type high hole mobility transistors (HHMT) 130 are completed, a photolithography process may be performed to form pad openings 118 in the passivation layers 114, 116 covering on the first gate $G_1$, the first source $S_1$ and the first drain $D_1$, the second gate $G_2$, the second source $S_2$ and the second drain $D_2$. The gates and sources/drains of the n-type high electron mobility transistors (HEMT) 120 and the p-type high hole mobility transistors (HHMT) 130 may be connected to external circuit through the pad openings 118.

According to the aforementioned embodiment of fabrication method as shown in FIGS. 1-6, the present invention hereby provides a 3D semiconductor device. As shown in FIG. 6, the 3D semiconductor device of present invention includes a buffer layer 108 with a first surface 108a and a second surface 108b opposite to the first surface 108a, a n-type high electron mobility transistor (HEMT) 120 disposed on the first surface 108a of the buffer layer 108, and a p-type high hole mobility transistor (HHMT) 130 disposed on the second surface 108b of the buffer layer 108. Please note that the n-type HEMT 120 or the p-type HHMT 130 may be designed as a normally-on device in depletion mode. Alternatively, they may be designed as a normally-off device in enhancement mode, depending on the requirement of products. Through the process as described in FIGS. 1-6, the 3D semiconductor device 100 of present invention vertically integrates complementary n-type HEMT 120 and p-type HHMT 130 in three-dimensional space. In this way, necessary layout area is significantly reduced to make them applicable in the field requiring devices with high frequency, high power, high voltage or high speed characteristics.

Figure 7:
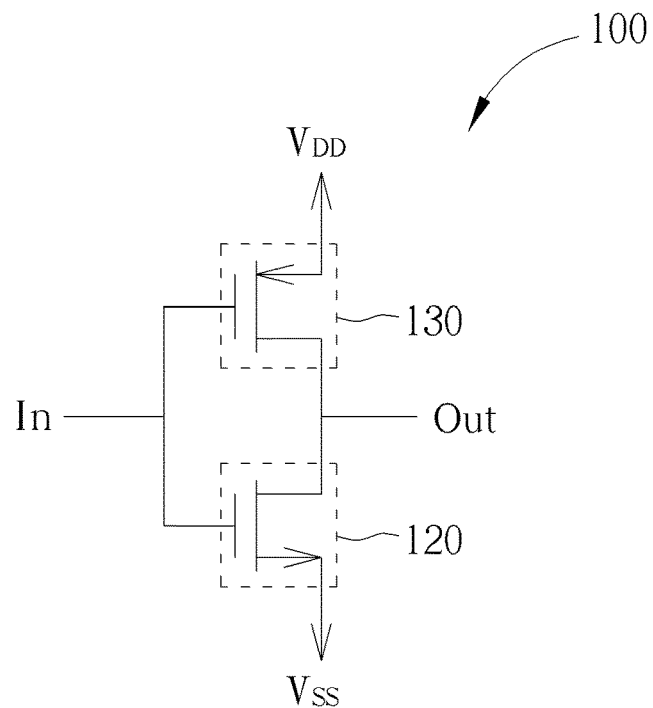
FIG. 7 is a circuit diagram of an inverter made by the 3D semiconductor structure of the present invention.

For example, please refer to the embodiment of FIG. 7, which is a circuit diagram of an inverter made by the 3D semiconductor structure 100 of the present invention. In this embodiment, the gates of n-type HEMT 120 and p-type HHMT 130 are connected to a common input In, the drains of n-type HEMT 120 and p-type HHMT 130 are connected to a common output Out, the source of n-type HEMT 120 is connected to a ground voltage $V_{SS}$, and the source of p-type HHMT 130 is connected to an operating voltage $V_{DD}$. Therefore, the 3D semiconductor structure constitutes an inverter structure. It can be understood from the embodiment above that the 3D semiconductor structure of present invention may include at least two transistors in an unit area for single device through this 3D stack scheme, especially for complementary transistors, thereby constituting a CMOS-type device.

After the description about the 3D semiconductor structure and relevant fabrication method of the present invention, the embodiment is now focused on the detail of different buffer layers in the 3D semiconductor structure of the present invention, wherein band diagrams are used to explain the influence of three different buffer layers to the characteristics of 3D semiconductor structure.

Figure 8:
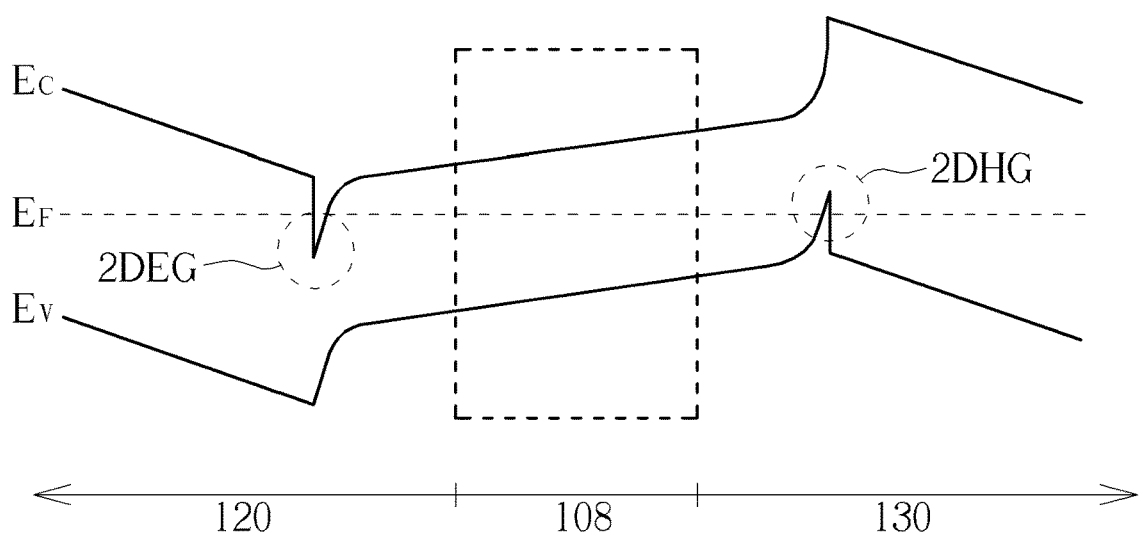
FIGS. 8-10 are band diagrams of three buffer layers with different characteristics in accordance with the preferred embodiment of present invention.

First, please refer to FIG. 8. Left portion of FIG. 8 is the energy band of n-type HEMT 120. It can be seen in the figure that a conductive band $E_C$ of the n-type HEMT falls below Fermi level $E_F$ to form a 2DEG channel since piezoelectric polarization at heterojunction between barrier layer and channel layer. Right portion of FIG. 8 is the energy band of p-type HHMT 130. It can be seen in the figure that a valence band $E_V$ of p-type HHMT rises above the Fermi level $E_F$ at heterojunction between barrier layer and channel layer to form a 2DHG channel. The band of doped p-type HHMT 130 is higher than the band of undoped n-type HEMT 120.

In the case that the channel layer of transistor is GaN, the material of buffer layer 108 may also be GaN, with dopants (e.g. Mg) the same as the one doped in doped GaN channel layer 106. More specifically, the concentration of dopant in the buffer layer 108 would gradually increase from zero at first surface 108a (adjacent to the n-type HEMT 120) to the same concentration as the concentration of dopant in doped GaN channel layer 106 at second surface 108b (adjacent to the p-type HHMT 130). In this way, the buffer layer 108 with identical concentration gradient of dopants may function as a transition layer for the lattices and energy bands between the n-type HEMT 120 and the p-type HHMT 130, thereby preventing the defect such as dislocation formed or grown in layer structures (e.g. undoped GaN channel layer 110 and undoped AlGaN barrier layer 112) formed above the buffer layer 108 and ensure the quality of the layer structures.

Figure 9:
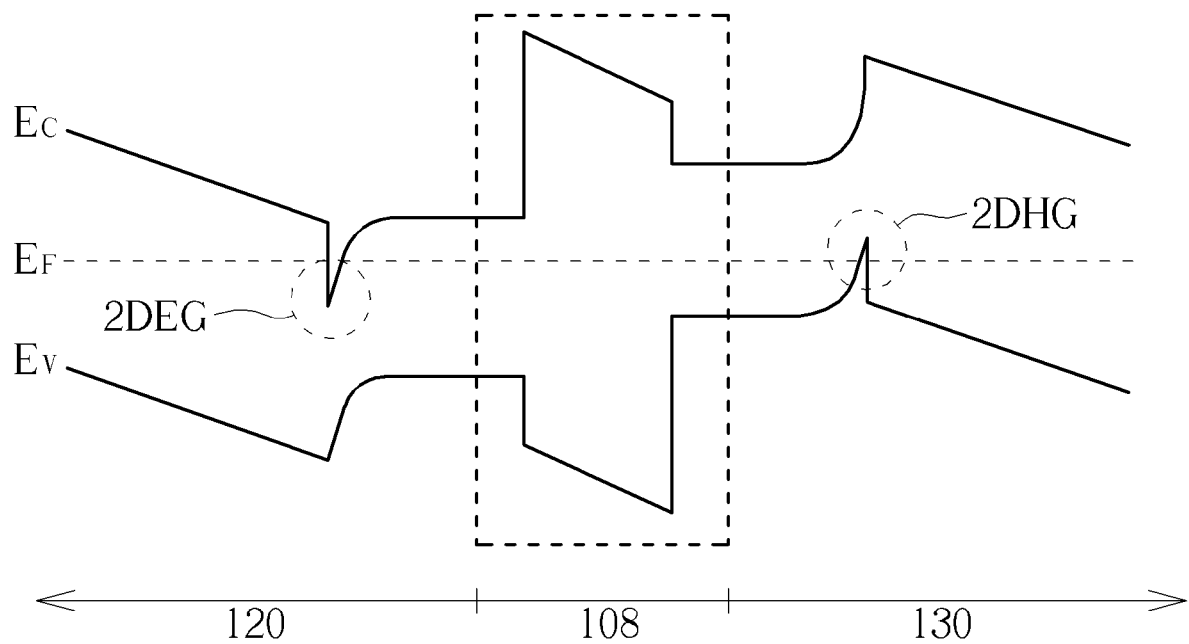

Next, please refer to FIG. 9. Regarding the influence of mutual noises between the n-type HEMT 120 and the p-type HHMT 130, the buffer layer 108 disposed therebetween may be designed as a wide-bandgap layer. As shown in the figure, bandgap of the wide-bandgap layer is larger than adjacent undoped GaN channel layer 110 and doped GaN channel layer 106. Due to quantum confinement effect, energetic charge carriers in n-type HEMT 120 or p-type HHMT 130 can't migrate to the other transistor. In the embodiment of present invention, the material of buffer layer 108 may be AlGaN or AlN, with bandgap quite larger than adjacent two GaN channel layers.

Figure 10:
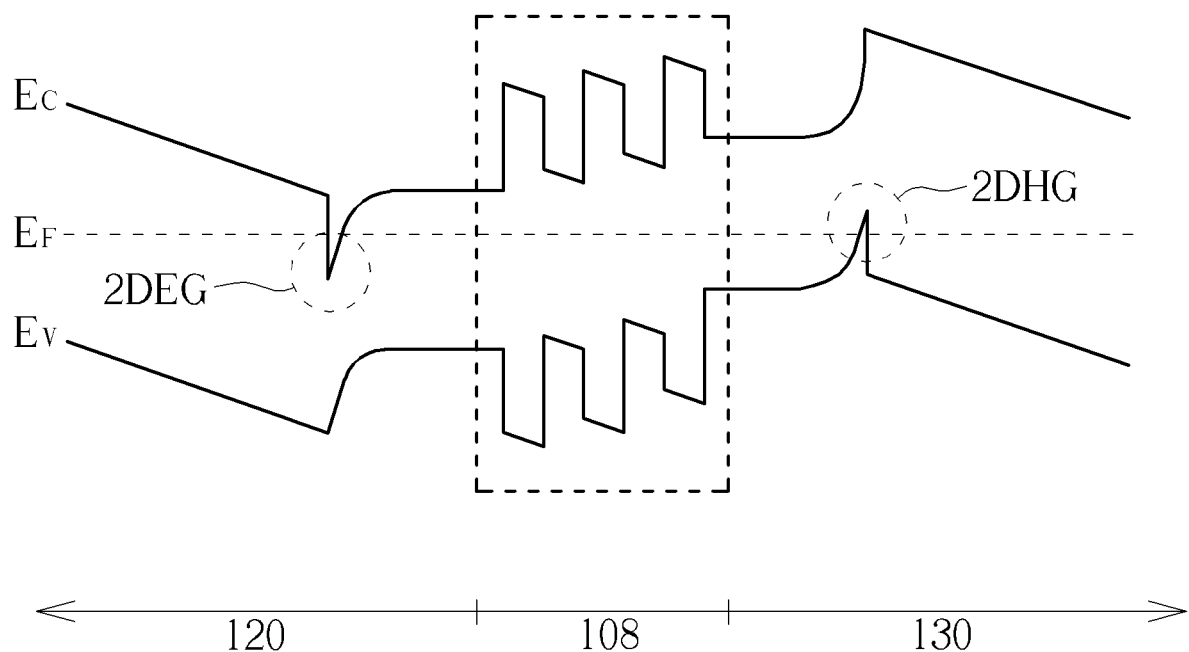

Lastly, please refer to FIG. 10. Alternatively, in the embodiment of present invention, the buffer layer 108 may be a super lattice stack, such as alternating aluminum gallium nitride layers and gallium nitride layers (AlGaN/

GaN) or alternating aluminum gallium nitride layers and indium gallium nitride (AlGaN/InGaN) layers. The advantage of using super lattice stack is that it can offset the vertical stress generated when growing the layer structures of 3D semiconductor structure through the horizontal strain of super lattice stack, thereby preventing the defects such as dislocation that may impact the quality of the layer structures.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A 3D semiconductor structure, comprising:
    a buffer layer with a first surface and a second surface opposite to said first surface;
    a n-type high electron mobility transistor (HEMT) disposed on said first surface of said buffer layer, wherein said n-type high electron mobility transistor comprises:
        an undoped gallium nitride (GaN) channel layer on said first surface of said buffer layer;
        an undoped aluminum gallium nitride (AlGaN) barrier layer on said undoped gallium nitride channel layer; and
        a gate, a source and a drain on said undoped aluminum gallium nitride barrier layer;
    a p-type high hole mobility transistor (HHMT) disposed on said second surface of said buffer layer.

2. The 3D semiconductor structure of claim 1, further comprising a passivation layer covering on said undoped aluminum gallium nitride barrier layer and on said gate, said source and said drain.

3. The 3D semiconductor structure of claim 1, wherein said p-type high hole mobility transistor comprises:
    a doped gallium nitride channel layer on said second surface of said buffer layer;
    a doped aluminum gallium nitride barrier layer on said doped gallium nitride channel layer; and
    a gate, a source and a drain on said undoped aluminum gallium nitride barrier layer.

4. The 3D semiconductor structure of claim 3, wherein dopants in said doped gallium nitride channel layer and said doped aluminum gallium nitride barrier layer comprise carbon (C), iron (Fe), magnesium (Mg) or zinc (Zn).

5. The 3D semiconductor structure of claim 3, wherein a material of said buffer layer is gallium nitride, and said buffer layer has the same dopant as said dopant in said doped gallium nitride channel layer and said doped aluminum gallium nitride barrier layer, and a concentration of said dopant in said buffer layer gradually increases from zero at said first surface to the same concentration as a concentration of said dopant in said doped gallium nitride channel layer.

6. The 3D semiconductor structure of claim 3, further comprising a passivation layer covering on said doped aluminum gallium nitride barrier layer and on said gate, said source and said drain.

7. The 3D semiconductor structure of claim 1, wherein said buffer layer is a wide-bandgap layer, and a bandgap of said wide-bandgap layer is larger than a bandgap at an interface between said buffer layer and said undoped gallium nitride channel layer and is larger than a bandgap at an interface between said buffer layer and said doped gallium nitride channel layer.

8. The 3D semiconductor structure of claim 7, wherein a material of said wide-bandgap layer is aluminum gallium nitride or aluminum nitride.

9. The 3D semiconductor structure of claim 1, wherein said buffer layer is a super lattice stack.

10. The 3D semiconductor structure of claim 9, wherein said super lattice stack comprises alternating aluminum gallium nitride layers and gallium nitride layers or comprises alternating aluminum gallium nitride layers and indium gallium nitride (InGaN) layers.

11. The 3D semiconductor structure of claim 10, wherein a gate of said n-type high electron mobility transistor and a gate of said p-type high hole mobility transistor connect to a common input voltage, and a drain of said n-type high electron mobility transistor and a drain of said p-type high hole mobility transistor connect to a common output voltage to form an inverter.

* * * * *